United States Patent
Zhu et al.

(10) Patent No.: US 8,536,669 B2
(45) Date of Patent: Sep. 17, 2013

(54) MAGNETIC ELEMENT WITH STORAGE LAYER MATERIALS

(75) Inventors: Xiaochun Zhu, San Diego, CA (US); Xia Li, San Diego, CA (US); Seung H. Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 837 days.

(21) Appl. No.: 12/352,648

(22) Filed: Jan. 13, 2009

(65) Prior Publication Data

US 2010/0176471 A1 Jul. 15, 2010

(51) Int. Cl.
*H01L 29/82* (2006.01)
*G11B 5/33* (2006.01)
*G11C 11/02* (2006.01)

(52) U.S. Cl.
USPC ..... 257/427; 257/421; 257/425; 257/E21.665

(58) Field of Classification Search
None
See application file for complete search history.

(56) References Cited

U.S. PATENT DOCUMENTS

| | | | |
|---|---|---|---|
| 7,149,105 B2 | 12/2006 | Brown et al. | |
| 7,583,529 B2 | 9/2009 | Chen et al. | |
| 8,084,835 B2 * | 12/2011 | Ranjan et al. | 257/421 |
| 2002/0054462 A1 * | 5/2002 | Sun et al. | 360/324.2 |
| 2006/0220084 A1 * | 10/2006 | Umehara et al. | 257/296 |
| 2007/0053112 A1 * | 3/2007 | Papworth Parkin | 360/324.2 |
| 2007/0063236 A1 | 3/2007 | Huai et al. | |
| 2007/0253118 A1 | 11/2007 | Hayakawa et al. | |
| 2008/0070063 A1 | 3/2008 | Ibusuki et al. | |
| 2008/0112093 A1 | 5/2008 | Sato et al. | |
| 2009/0027810 A1 * | 1/2009 | Horng et al. | 360/324.2 |

FOREIGN PATENT DOCUMENTS

| JP | 2007294737 A | 11/2007 |
|---|---|---|
| TW | 200820253 A | 5/2008 |

OTHER PUBLICATIONS

International Search Report & Written Opinion—PCT/US2010/020919, International Search Authority—European Patent Office—May 12, 2010.

* cited by examiner

*Primary Examiner* — Zandra Smith
*Assistant Examiner* — Pamela E Perkins
(74) *Attorney, Agent, or Firm* — Michelle S. Gallardo

(57) ABSTRACT

According to an embodiment of the invention, a magnetic tunnel junction (MTJ) element includes a reference ferromagnetic layer, a storage ferromagnetic layer, and an insulating layer. The storage ferromagnetic layer includes a CoFeB sub-layer coupled to a CoFe sub-layer and/or a NiFe sub-layer through a non-magnetic sub-layer. The insulating layer is disposed between the reference and storage ferromagnetic layers.

65 Claims, 6 Drawing Sheets

PARALLEL MAGNETIZATION
LOW RESISTANCE
STATE "0"

ANTIPARALLEL MAGNETIZATION
HIGH RESISTANCE
STATE "1"

READ & WRITE

MAGNETIC ELEMENT WITH STORAGE LAYER MATERIALS

FIELD OF DISCLOSURE

Embodiments of the invention are related to magnetic element devices. More particularly, embodiments of the invention are related to magnetic elements including a novel storage layer material.

BACKGROUND

Magnetoelectronic devices, also referred to as spin electronics devices or spintronics devices, are used in numerous information technologies, and provide for non-volatile, reliable, radiation resistant, and high-density data storage and retrieval. Examples of magnetoelectronic devices include, but are not limited to, magnetic random access memory (MRAM), magnetic sensors, and read/write heads for disk drives.

Typically, a magnetoelectronic device, such as a magnetic memory element, has a structure that includes multiple ferromagnetic layers separated by at least one non-magnetic layer. Information is stored in a magnetic memory element as the direction of magnetization vectors in the magnetic layers. Magnetization vectors in one magnetic layer, for instance, are magnetically fixed or pinned, while the magnetization direction of the other magnetic layer is free to switch between the same and opposite directions that are called "parallel" and "antiparallel" states, respectively. In response to parallel and antiparallel states, the magnetic memory element represents two different resistances. The resistance has a minimum value when the magnetization vectors of the two magnetic layers point in substantially the same direction, and a maximum value when the magnetization vectors of the two magnetic layers point in substantially opposite directions. Accordingly, a detection of change in resistance allows a device, such as an MRAM device, to detect the information stored in the magnetic memory element.

FIGS. 1A and 1B illustrate a type of magnetic memory element known as a magnetic tunnel junction element in parallel and anti-parallel states, respectively.

As shown, a magnetic tunnel junction (MTJ) element 100 can be formed from two magnetic layers 110 and 130, each of which can hold a magnetic field, separated by an insulating (tunnel barrier) layer 120. One of the two layers (e.g., reference layer 110), is set to a particular polarity. The other layer's (e.g., storage layer 130) polarity 132 is free to change to match that of an external field that can be applied. A change in the polarity 132 of the storage layer 130 will change the resistance of the MTJ element 100. For example, when the polarities are aligned (FIG. 1A), a low resistance state exists. When the polarities are not aligned (FIG. 1B), a high resistance state exists. The illustration of MTJ 100 has been simplified and those skilled in the art will appreciate that each layer illustrated may comprise one or more layers of materials, as is known in the art.

In contrast to conventional RAM technologies which store data as electric charges or current flows, MRAM stores information magnetically. MRAM has several desirable characteristics that make it a candidate for a universal memory, such as high speed, high density (i.e., small bitcell size), low power consumption, and no degradation over time. However, MRAM has scalability issues. Specifically, as the bit cells become smaller, the magnetic fields used for switching the memory state increase. Accordingly, current density and power consumption increase to provide the higher magnetic fields, thus limiting the scalability of the MRAM.

Unlike conventional MRAM, Spin Transfer Torque Magnetoresistive Random Access Memory (STT-MRAM) uses electrons that become spin-polarized as the electrons pass through a thin film (spin filter). STT-MRAM is also known as Spin Transfer Torque RAM (STT-RAM), Spin Torque Transfer Magnetization Switching RAM (Spin-RAM), and Spin Momentum Transfer (SMT-RAM). During the write operation, the spin-polarized electrons exert a torque on the free layer, which can switch the polarity of the free layer. The read operation is similar to conventional MRAM in that a current is used to detect the resistance/logic state of the MTJ storage element, as discussed in the foregoing. As illustrated in FIG. 2A, a STT-MRAM bit cell 200 includes MTJ 205, transistor 210, bit line 220 and word line 230. The transistor 210 is switched on for both read and write operations to allow current to flow through the MTJ 205, so that the logic state can be read or written.

Referring to FIG. 2B, a more detailed diagram of a STT-MRAM cell 201 is illustrated, for further discussion of the read/write operations. In addition to the previously discussed elements such as MTJ 205, transistor 210, bit line 220 and word line 230, a source line 240, sense amplifier 250, read/write circuitry 260 and bit line reference 270 are illustrated. As discussed above, the write operation in an STT-MRAM is electrical. Read/write circuitry 260 generates a write voltage between the bit line 220 and the source line 240. Depending on the polarity of the voltage between bit line 220 and source line 240, the polarity of the free layer of the MTJ 205 can be changed and correspondingly the logic state can be written to the cell 201. Likewise, during a read operation, a read current is generated, which flows between the bit line 220 and source line 240 through MTJ 205. When the current is permitted to flow via transistor 210, the resistance (logic state) of the MTJ 205 can be determined based on the voltage differential between the bit line 220 and source line 240, which is compared to a reference 270 and then amplified by sense amplifier 250. Those skilled in the art will appreciate the operation and construction of the memory cell 201 is known in the art. Additional details are provided, for example, in M. Hosomi, et al., A Novel Nonvolatile Memory with Spin Transfer Torque Magnetoresistive Magnetization Switching: Spin-RAM, proceedings of IEDM conference (2005), which is incorporated herein by reference in its entirety.

Referring back to the MTJ structure of FIG. 1, storage layer 130 and reference layer 110 have been conventionally made of a Cobalt-Iron-Boron (CoFeB) material, while tunnel layer 120 has been conventionally made of a Magnesium oxide (MgO) material in STT-MRAM. However CoFeB has drawbacks as a storage layer material. For example, it has a relatively large magnetostriction. Magnetostriction is a property of ferromagnetic materials that causes them to change their shape when subjected to a magnetic field. Accordingly, the use of CoFeB can induce a relatively wide and uncontrollable switching field or switching current distribution in a memory array.

SUMMARY

Exemplary embodiments of the invention are directed to magnetic elements including a novel storage layer material.

Accordingly, one embodiment of the invention can include a magnetic tunnel junction (MTJ) element. The MTJ includes a reference ferromagnetic layer, a storage ferromagnetic layer, and an insulating layer. The storage ferromagnetic layer includes a Cobalt-Iron-Boron (CoFeB) sub-layer coupled to a CoFe sub-layer through a non-magnetic sub-layer. The insulating layer is disposed between the reference and storage ferromagnetic layers.

Another embodiment of the invention can include another MTJ element. The MTJ also includes a reference ferromagnetic layer, a storage ferromagnetic layer, and an insulating layer. Here, the storage ferromagnetic layer includes a CoFeB sub-layer coupled to a Nickel-Iron (NiFe) sub-layer through a non-magnetic sub-layer. The insulating layer is also disposed between the reference and storage ferromagnetic layers.

Another embodiment of the invention can include a method of forming an MTJ device. The method includes forming a reference ferromagnetic layer, forming a storage ferromagnetic layer comprising a CoFeB sub-layer coupled to a CoFe sub-layer through a non-magnetic sub-layer, and forming an insulating layer disposed between the reference and storage ferromagnetic layers.

Another embodiment of the invention can include another method of forming an MTJ device. Here, the method includes forming a reference ferromagnetic layer, forming a storage ferromagnetic layer comprising a CoFeB sub-layer coupled to a NiFe sub-layer through a non-magnetic sub-layer, and forming an insulating layer disposed between the reference and storage ferromagnetic layers.

Another embodiment of the invention can include a memory comprising a transistor and a magnetic tunnel junction (MTJ) element coupled in series to the transistor. The magnetic tunnel junction (MTJ) element can include: a reference ferromagnetic layer; a storage ferromagnetic layer comprising a Cobalt-Iron-Boron (CoFeB) sub-layer coupled to a Cobalt-Iron (CoFe) sub-layer through a non-magnetic sub-layer; and an insulating layer disposed between the reference and storage ferromagnetic layers.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Figure 1A:
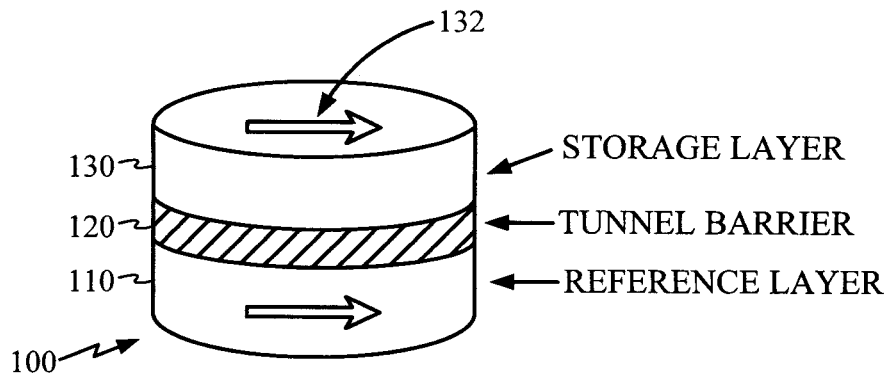
FIGS. 1A and 1B illustrate a type of magnetic memory element known as a magnetic tunnel junction element in parallel and anti-parallel states, respectively.

Aspects of embodiments of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of embodiments of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation. As used herein, and commonly in the art, the symbol A refers to the angstroms unit of measure.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

As discussed in the background, Cobalt-Iron-Boron (CoFeB) has drawbacks as a storage layer material because it has, for example, an undesirably large magnetostriction property. Accordingly, embodiments of the invention provide a novel storage layer for use in magnetic memory elements that help to mitigate one or more drawbacks of CoFeB.

FIGS. 3A through 3D each illustrate an MTJ element including a novel storage layer according to an embodiment of the invention. As used herein, reference numeral 330 without a corresponding letter a-d refers to storage layers 330a-d collectively.

Figure 1B:
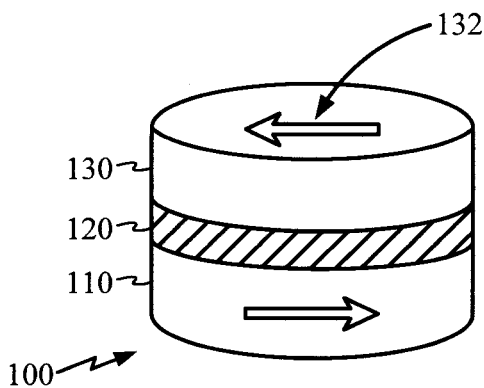
Figure 2A:
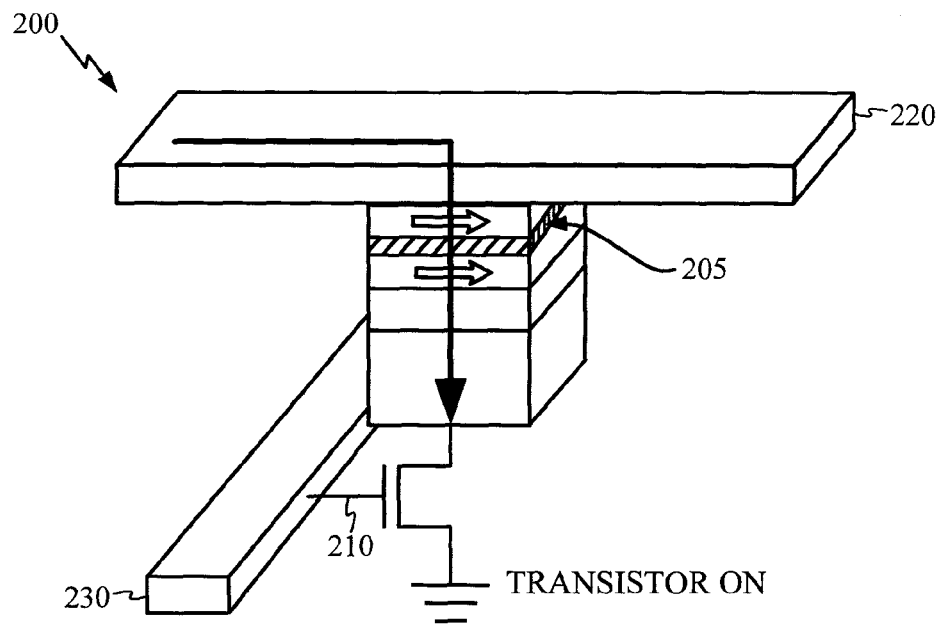
FIGS. 2A and 2B illustrate a memory cell of a conventional STT-MRAM cell using an MTJ element as a magnetic storage device.
Figure 2B:
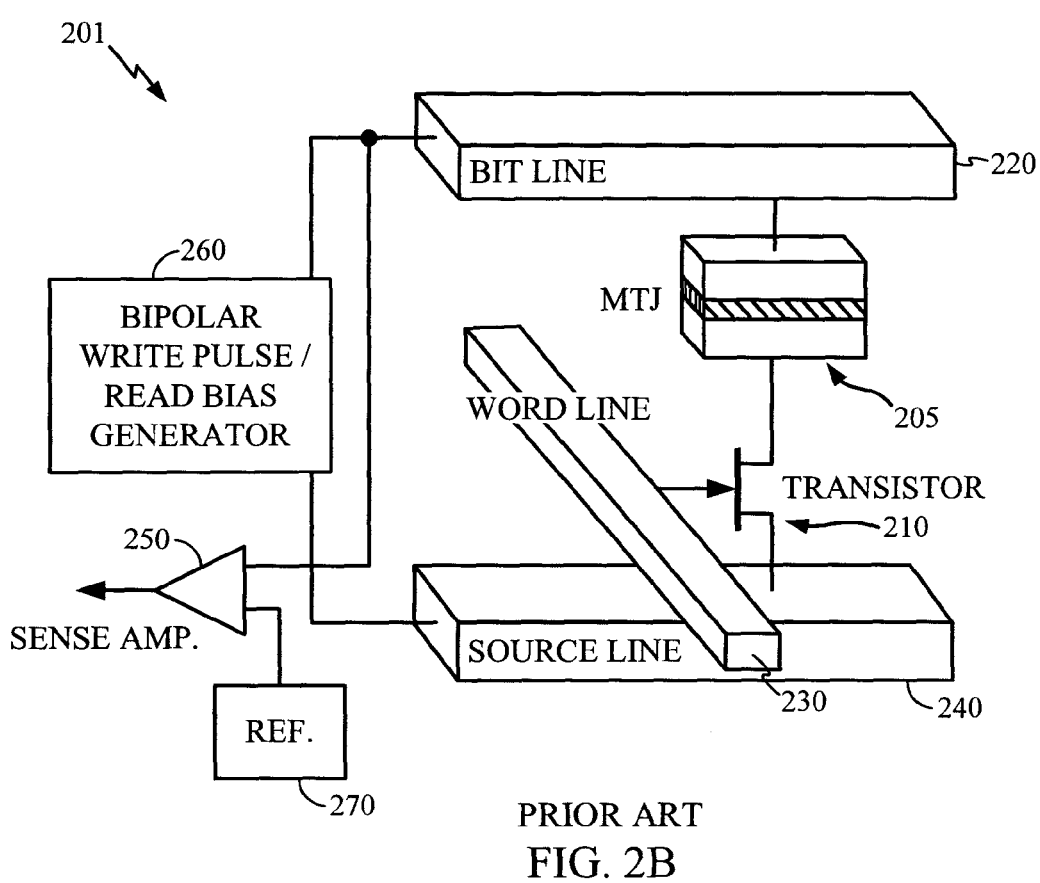

As shown, MTJ 300 is formed of a reference layer 310, an insulating layer 320, and a storage layer 330. As in the conventional design of FIG. 1, reference layer 310 can be made of CoFeB or the like, and insulating layer 320 can be made of Magnesium oxide (MgO) or the like. In contrast to the design of FIG. 1, however, storage layer 330 of MTJ 300 is made of a multi-layer, ferromagnetic structure of Cobalt-Iron-Boron (CoFeB)/(non-magnetic sub-layer)/(auxiliary sub-layer), where a CoFeB sub-layer is coupled to a sub-auxiliary layer through a non-magnetic (e.g., Ruthenium (Ru) spacer sub-layer), as will be described below. For ease of notation and explanation Ruthenium or Ru may be used for the non-magnetic sub-layer in the following description. However, it will be appreciated that embodiments of the invention are not limited to using Ru as the non-magnetic sub-layer. For example, Chromium (Cr) or Tantalum (Ta) could also be used as the non-magnetic sub-layer. Further, it will be appreciated that various layers and sub-layers described herein can include additional layers and sub-layers to those explicitly shown.

The CoFeB sub-layer of storage layer 330 can either be ferromagnetically or anti-ferromagnetically coupled with the auxiliary sub-layer, depending on the exchange coupling strength between the two sub-layers. In general, exchange coupling refers to the idea that the magnetic moments in the two sub-layers try to magnetically couple with each other either in the parallel or anti-parallel direction depending on the Ru thickness, so that the exchange energy can be minimized. Put simply, magnetic exchange coupling is the exchange strength needed for magnetic moments to align themselves either in the parallel or anti-parallel direction. Specifically, ferromagnetic exchange coupling refers to the state in which magnetization vectors of the two sub-layers are relatively parallel, and anti-ferromagnetic exchange coupling refers to the state in which magnetization vectors of the two sub-layers are relatively anti-parallel.

It has been noted that when the exchange coupling strength is stronger, the critical switching current will be lower. Further, the exchange coupling strength can be controlled by adjusting the thickness of the non-magnetic (e.g., Ru sublayer). In general, when a thin non-magnetic metal layer is sandwiched by two ferromagnetic layers, the electrons in the center layer become polarized with oscillatory direction. For example, a relatively thin Ru sub-layer of approximately 6 Å-10 Å (e.g., 8 Å) may provide for anti-ferromagnetic coupling. A thickness of approximately 2 Å-5 Å or a thickness to approximately 10 Å-15 Å (e.g., 12 Å) of the Ru sub-layer may provide for ferromagnetic coupling. Increasing the Ru sub-layer thickness further to approximately 15 Å-20 Å (e.g., 18 Å) may provide for anti-ferromagnetic coupling yet again. However, while the polarization direction may be oscillatory in nature, the magnitude of the exchange coupling strength is dampened with increasing RU sub-layer thickness such that the oscillations die out as the RU sub-layer becomes too thick. Accordingly, the type of coupling between the CoFeB sub-layer and the sub-auxiliary layer, as well as the exchange coupling strength, can be set according to design standards by choosing an appropriate Ru sub-layer thickness. Likewise, the thickness of the other ferromagnetic sub-layers can be on the order of 5 Å-50 Å, but embodiments of the invention are not limited to any specific thickness.

To decrease the critical switching current and improve STT-MRAM cell stability, the auxiliary sub-layer according to one or more embodiments of the invention can include a CoFe material. Further, to help mitigate magnetostriction, the auxiliary sub-layer according to one or more embodiments of the invention can include a NiFe material, in addition to or in substitution of the CoFe material, depending on the application.

Figure 3A:
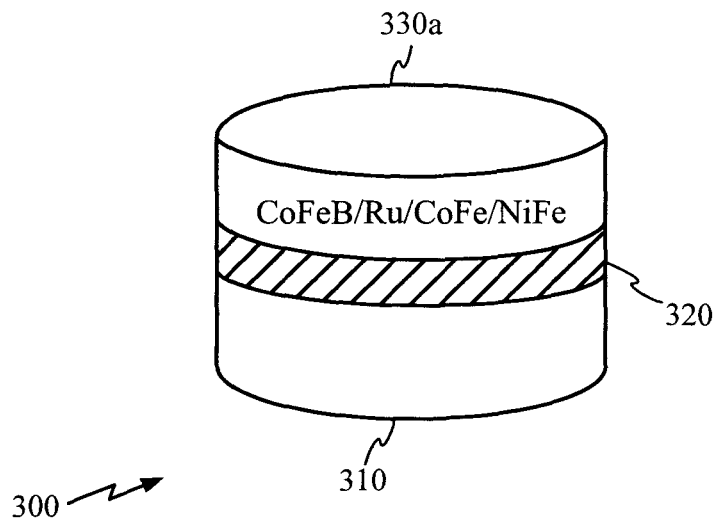
FIGS. 3A through 3D each illustrate an MTJ element including a novel storage layer.
Figure 3B:
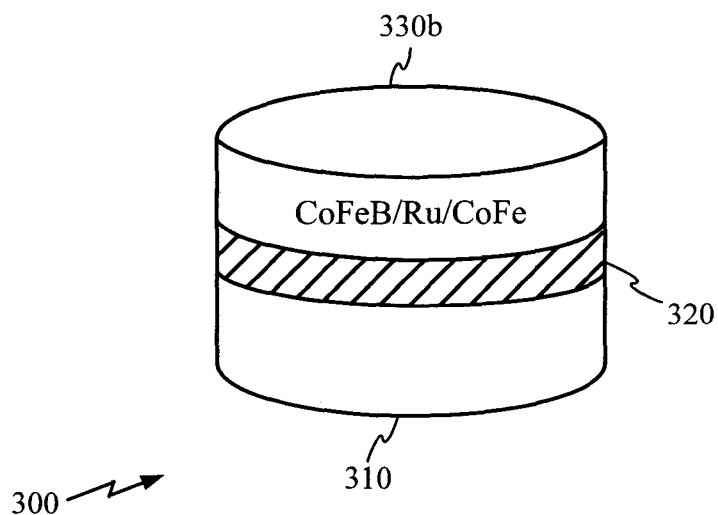
Figure 3C:
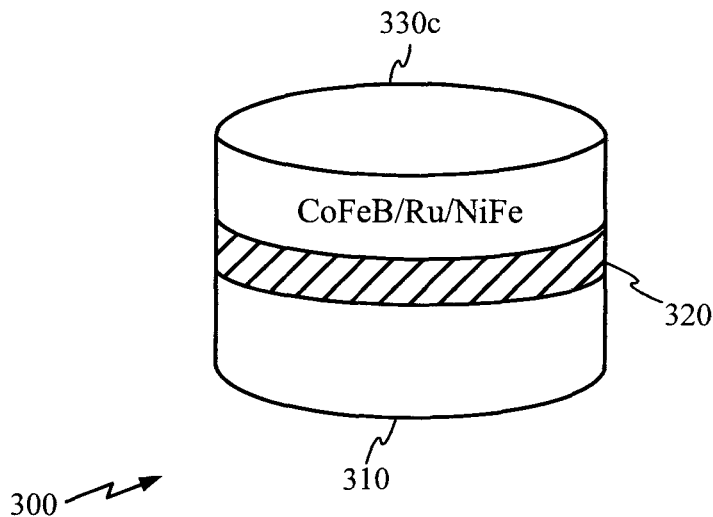
Figure 3D:
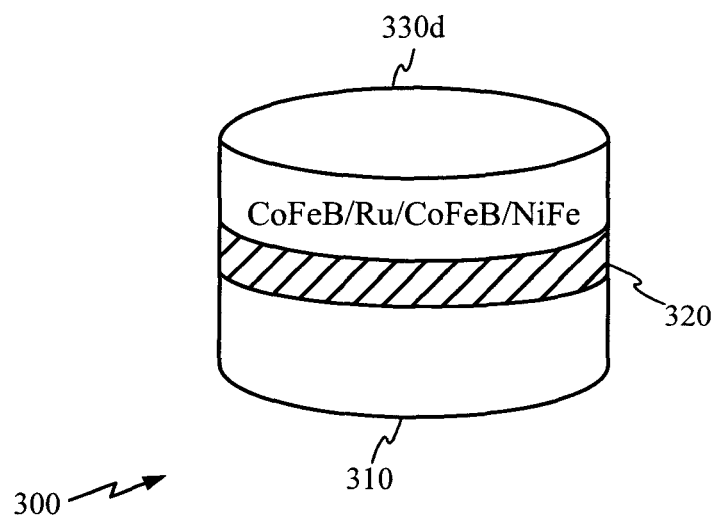

In particular, FIG. 3A illustrates a storage layer 330a made of a CoFeB/non-magnetic/CoFe/NiFe (e.g., CoFeB/Ru/CoFe/NiFe) layer structure. FIG. 3B illustrates a storage layer 330b made of a CoFeB/non-magnetic/CoFe (e.g., CoFeB/Ru/CoFe) layer structure. FIG. 3C illustrates a storage layer 330c made of a CoFeB/non-magnetic/NiFe (e.g., CoFeB/Ru/NiFe) layer structure. FIG. 3D illustrates a storage layer 330d made of a CoFeB/non-magnetic/CoFeB/NiFe (e.g., CoFeB/Ru/CoFeB/NiFe) layer structure. The structures of FIGS. 3A and 3B use a CoFe material as part of the auxiliary sub-layer to provide a relatively strong exchange coupling with the CoFeB sub-layer through the non-magnetic (e.g., Ru) sub-layer, thereby reducing the critical switching current for write operations. The structures of FIGS. 3A, 3C, and 3D use a NiFe material to reduce magnetostriction induced switching current and switching field variation in a memory array. Additionally, as noted above, the Ru sub-layer described above and illustrated in FIGS. 3A-D can be replaced by other non-magnetic materials to form the non-magnetic sub-layer.

Figure 4:
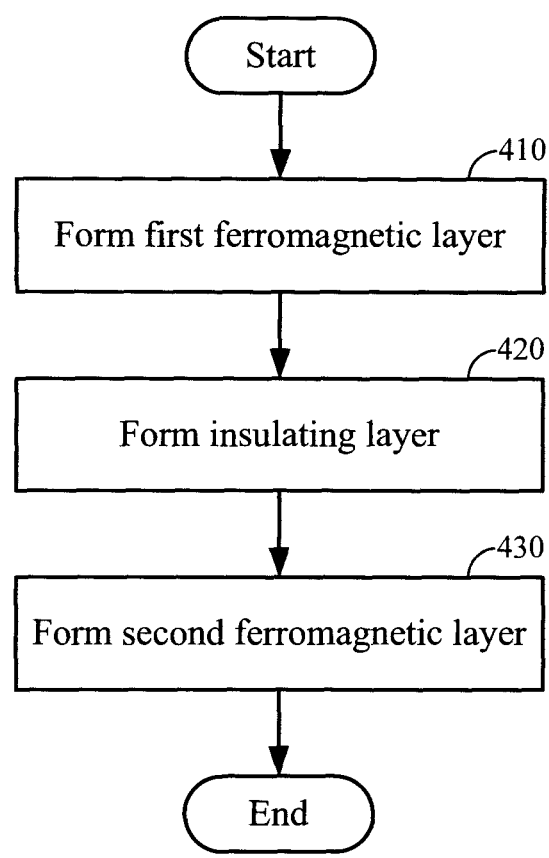
FIG. 4 illustrates a method of fabricating an MTJ element including a novel storage layer.

FIG. 4 illustrates a method of fabricating an MTJ element including a novel storage layer according to embodiments of the invention.

With reference to FIGS. 3 and 4, MTJ 300 may be fabricated by forming a first ferromagnetic layer 310 (i.e., one of the storage layer 330 and reference layer 310) on a substrate or another layer (block 410). An insulating layer 320 is formed on the first ferromagnetic layer 310 (block 420). A second ferromagnetic layer 330 (i.e., the other of the storage layer 330 and reference layer 310) is formed on the insulating layer 320 (block 430). Again, each layer may be composed of one or multiple layers made of one or more materials, and a layer said to be formed on another layer need not necessarily be formed in direct contact with that layer. As illustrated in FIGS. 3A through 3D, the storage layer can be formed of any one of various combinations described herein (e.g., CoFeB/Ru/CoFe/NiFe, CoFeB/Ru/CoFe, CoFeB/Ru/NiFe, or CoFeB/Ru/CoFeB/NiFe) according to various embodiments of the invention.

Figure 5:
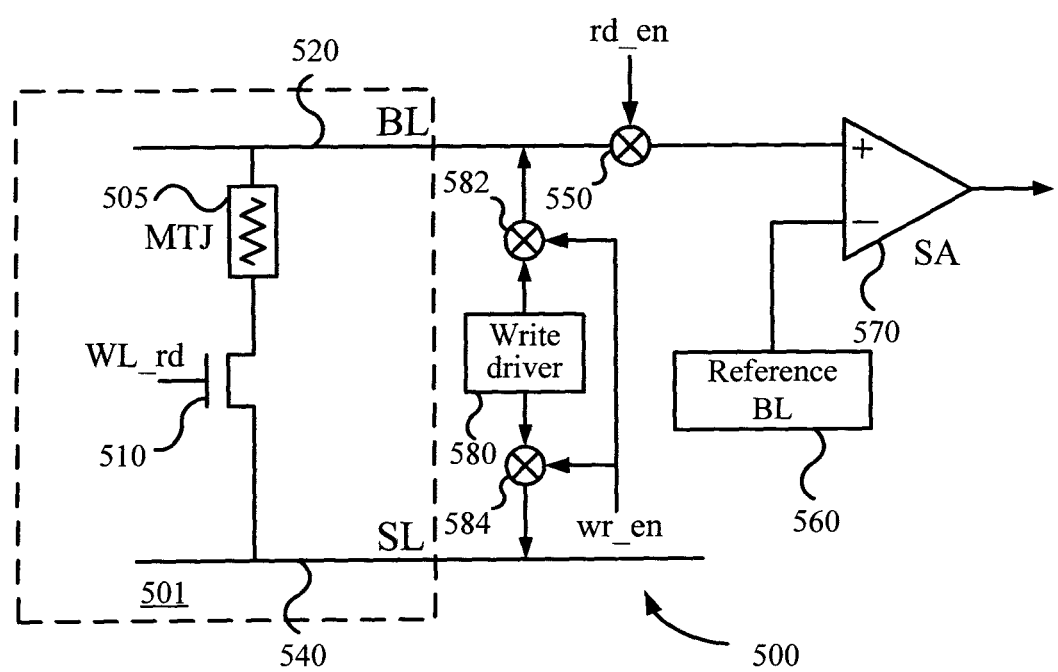
FIG. 5 illustrates an STT-MRAM circuit including an MTJ element.

FIG. 5 illustrates memory element (e.g., an STT-MRAM circuit) including an MTJ element according to an embodiment of the invention.

The circuit includes a bit cell 501 including a MTJ 505 and word line transistor 510 coupled between bit line (BL) 520 and source line (SL) 540. Word line transistor 510 receives a word line read voltage (WL_rd) from the word line (not shown). A read isolation element 550 is coupled to the bit line 520 to isolate sense amplifier 570 during a write operation. Element 550 (e.g., read mux) can be used to select one of the bit lines during read operation as well as provide sense amplifier isolation. As will be appreciated by those skilled in the art, read isolation element 550 can be any device or combination of devices that can couple the sense amplifier 570 to the bit line 520 during read operations and can isolate sense amplifier 570 during the write operations. For example, the isolation element 550 can be a transmission gate coupled in series with an input of sense amplifier 570. However, those skilled in the art will appreciate that other devices and/or combinations of devices such as multiplexers and the like may be used. Further, those skilled in the art will appreciate that the circuit configuration illustrated herein is merely to facilitate the description of aspects of embodiments of the invention and is not intended to limit the embodiments to the illustrated elements and/or arrangements.

Referring back to FIG. 5, the isolation element 550 can receive a read enable signal (rd_en) to coordinate with the read operation. A sense amplifier 570 is coupled to the bit line 520 and to a reference 560. Sense amplifier 570 can be used to determine the state of the bit cell 501 by amplifying the voltage differential between the bit line 520 and the reference 560 at the input of the sense amplifier 570 during the read operation. During the read operation, transistor 510 is conducting and a read current flows through the MTJ 505. The read isolation element 550 will be conducting and a voltage in proportion to the resistance of the MTJ 505 will be generated and detected at sense amplifier 570. As discussed above, the resistance will vary based on the logic state of the MTJ 505. Accordingly, the data stored in bit cell 501 can be read. A write driver 580 and write isolation elements 582 and 584 are coupled between the bit line 520 and source line 540 to enable selection of a bit line and writing data to bit cell 501.

MTJ 505 can be implemented using the techniques described herein to decrease the critical switching current, help mitigate magnetostriction, and improve STT-MRAM cell stability. For example, MTJ 505 may be implemented as shown in any one of FIGS. 3A though 3D and/or fabricated as illustrated in FIG. 4. Further, it will be appreciated that memory arrays can be formed from arrays of individual bit cells formed of MTJ 505 and transistor 510.

While the foregoing disclosure shows illustrative embodiments of the invention, it should be noted that various changes and modifications could be made herein without departing from the scope of embodiments of the invention as defined by the appended claims. For example, while the techniques described herein for fabricating magnetic elements have been generally directed towards MTJ elements and STT-MRAM devices, one skilled in the art will appreciate that the storage layers presented herein may be used in conjunction with various magneto-electric elements in various applications to provide improved performance. Also, specific logic signals corresponding to the transistors/circuits to be activated, may be changed as appropriate to achieve the disclosed functionality as the transistors/circuits may be modified to complementary devices (e.g., interchanging PMOS and NMOS devices). Likewise, the functions, steps and/or actions of the methods in accordance with the embodiments of the invention described herein need not be performed in the particular order shown. Furthermore, although elements of the invention may be described or claimed in the singular, the plural is contemplated unless limitation to the singular is explicitly stated.

What is claimed is:

1. A magnetic tunnel junction (MTJ) element comprising:
a reference ferromagnetic layer;
a storage ferromagnetic layer comprising a Cobalt-Iron-Boron (CoFeB) sub-layer coupled to a Cobalt-Iron (CoFe) sub-layer through a non-magnetic sub-layer; and
an insulating layer disposed between the reference and storage ferromagnetic layers, wherein the non-magnetic sub-layer is Chromium (Cr).

2. The MTJ element of claim 1, wherein at least one of the CoFeB sub-layer and the CoFe sub-layer has a thickness of approximately 5Å to 50Å.

3. The MTJ element of claim 2, wherein said non-magnetic sub-layer has a thickness of approximately 2Å to 5Å.

4. The MTJ element of claim 2, wherein said non-magnetic sub-layer has a thickness of approximately 10Å to 15Å.

5. The MTJ element of claim 2, wherein said non-magnetic sub-layer has a thickness of approximately 15Å to 20Å.

6. The MTJ element of claim 1, wherein said non-magnetic sub-layer has a thickness of approximately 2Å to 5Å.

7. The MTJ element of claim 1, wherein said non-magnetic sub-layer has a thickness of approximately 10Å to 15Å.

8. The MTJ element of claim 1, wherein said non-magnetic sub-layer has a thickness of approximately 15Å to 20Å.

9. The MTJ element of claim 1, wherein said non-magnetic sub-layer has a thickness, and wherein said non-magnetic sub-layer having said thickness provides a ferromagnetic coupling between the CoFeB sub-layer and the CoFe sub-layer.

10. The MTJ element of claim 1, wherein said non-magnetic sub-layer has a thickness, and wherein said non-magnetic sub-layer having said thickness provides a synthetic anti-ferromagnetic coupling between the CoFeB sub-layer and the CoFe sub-layer.

11. The MTJ element of claim 1, wherein said non-magnetic sub-layer is configured to provide a ferromagnetic coupling between the CoFeB sub-layer and the CoFe sub-layer.

12. The MTJ element of claim 11, wherein said non-magnetic sub-layer has a thickness of approximately 2Å to 5Å.

13. The MTJ element of claim 11, wherein said non-magnetic sub-layer has a thickness of approximately 15Å to 20Å.

14. The MTJ element of claim 1, wherein said non-magnetic sub-layer is configured to provide a synthetic anti-ferromagnetic coupling between the CoFeB sub-layer and the CoFe sub-layer.

15. The MTJ element of claim 14, wherein said non-magnetic sub-layer has a thickness of approximately 10Å to 15Å.

16. A magnetic tunnel junction (MTJ) element having a reference ferromagnetic reference layer, a Cobalt-Iron-Boron (CoFeB) storage ferromagnetic layer having a magnetostriction, and an insulating layer disposed between the reference ferromagnetic layer and the storage ferromagnetic layers, comprising:
means for switching a magnetization state of the CoFeB storage ferromagnetic layer between a parallel alignment and an anti-parallel alignment with the reference ferromagnetic reference layer; and
means for mitigating the magnetostriction of the CoFeB storage ferromagnetic layer.

17. A magnetic tunnel junction (MTJ) element comprising:
a reference ferromagnetic layer;
a storage ferromagnetic free layer comprising a first ferromagnetic sub-layer coupled to a second ferromagnetic sub-layer through a non-magnetic sub-layer, wherein the first ferromagnetic sub-layer comprises a layer having Cobalt-Iron-Boron (CoFeB), the second ferromagnetic sub-layer comprises a layer having Nickel-Iron (NiFe), and the non-magnetic sub-layer comprises at least one non-magnetic material selected from the group consisting of (Chromium (Cr) and Tantalum (Ta)); and
an insulating layer disposed between the reference layer and the storage ferromagnetic free layer.

18. The MTJ element of claim 17, wherein the second ferromagnetic sub-layer further comprises another layer, wherein said another layer comprises CoFeB.

19. The MTJ element of claim 18, wherein said another layer of the second ferromagnetic sub-layer is arranged between the non-magnetic sub-layer and the layer of the second ferromagnetic sub-layer comprising NiFe.

20. The MTJ element of claim 17, wherein the second ferromagnetic sub-layer further comprises another layer, wherein said another layer comprises CoFe.

21. The MTJ element of claim 20, wherein said another layer of the second ferromagnetic sub-layer is arranged between the non-magnetic sub-layer and the layer of the second ferromagnetic sub-layer comprising NiFe.

22. The MTJ element of claim 17, wherein the non-magnetic sub-layer comprises Cr.

23. The MTJ element of claim 22, wherein the second ferromagnetic sub-layer further comprises another layer, wherein said another layer comprises CoFeB.

24. The MTJ element of claim 23, said another layer of the second ferromagnetic sub-layer is arranged between the non-magnetic sub-layer and the layer of the second ferromagnetic sub-layer comprising NiFe.

25. The MTJ element of claim 24, wherein said non-magnetic sub-layer has a thickness of approximately 2Å to 5Å.

26. The MTJ element of claim 24, wherein said non-magnetic sub-layer has a thickness of approximately 10Å to 15Å.

27. The MTJ element of claim 24, wherein said non-magnetic sub-layer has a thickness of approximately 15Å to 20Å.

28. The MTJ element of claim 24, wherein said non-magnetic sub-layer has a thickness, and wherein said non-magnetic sub-layer having said thickness provides a ferromagnetic coupling between the first ferromagnetic sub-layer and the second ferromagnetic sub-layer.

29. The MTJ element of claim 24, wherein said non-magnetic sub-layer has a thickness, and wherein said non-magnetic sub-layer having said thickness provides a synthetic anti-ferromagnetic coupling between the first ferromagnetic sub-layer and the second ferromagnetic sub-layer.

30. The MTJ element of claim 24, wherein said non-magnetic sub-layer is configured to provide a ferromagnetic coupling between the first ferromagnetic sub-layer and the second ferromagnetic sub-layer.

31. The MTJ element of claim 30, wherein said non-magnetic sub-layer has a thickness of approximately 2Å to 5Å.

32. The MTJ element of claim 30, wherein said non-magnetic sub-layer has a thickness of approximately 15Å to 20Å.

33. The MTJ element of claim 24, wherein said non-magnetic sub-layer is configured to provide a synthetic anti-ferromagnetic coupling between the first ferromagnetic sub-layer and the second ferromagnetic sub-layer.

34. The MTJ element of claim 33, wherein said non-magnetic sub-layer has a thickness of approximately 10Å to 15Å.

35. The MTJ element of claim 22, wherein the second ferromagnetic sub-layer further comprises another layer, wherein said another layer comprises CoFe.

36. The MTJ element of claim 35, wherein said another layer of the second ferromagnetic sub-layer is arranged between the non-magnetic sub-layer and the layer of the second ferromagnetic sub-layer comprising NiFe.

37. The MTJ element of claim 22, wherein said non-magnetic sub-layer has a thickness of approximately 2Å to 5Å.

38. The MTJ element of claim 22, wherein said non-magnetic sub-layer has a thickness of approximately 10Å to 15Å.

39. The MTJ element of claim 22, wherein said non-magnetic sub-layer has a thickness of approximately 15Å to 20Å.

40. The MTJ element of claim 22, wherein said non-magnetic sub-layer has a thickness, and wherein said non-magnetic sub-layer having said thickness provides a ferromagnetic coupling between the first ferromagnetic sub-layer and the second ferromagnetic sub-layer.

41. The MTJ element of claim 22, wherein said non-magnetic sub-layer has a thickness, and wherein said non-magnetic sub-layer having said thickness provides a synthetic anti-ferromagnetic coupling between the first ferromagnetic sub-layer and the second ferromagnetic sub-layer.

42. The MTJ element of claim 22, wherein said non-magnetic sub-layer is configured to provide a ferromagnetic coupling between the first ferromagnetic sub-layer and the second ferromagnetic sub-layer.

43. The MTJ element of claim 42, wherein said non-magnetic sub-layer has a thickness of approximately 2Å to 5Å.

44. The MTJ element of claim 42, wherein said non-magnetic sub-layer has a thickness of approximately 15Å to 20Å.

45. The MTJ element of claim 22, wherein said non-magnetic sub-layer is configured to provide a synthetic anti-ferromagnetic coupling between the first ferromagnetic sub-layer and the second ferromagnetic sub-layer.

46. The MTJ element of claim 45, wherein said non-magnetic sub-layer has a thickness of approximately 10Å to 15Å.

47. The MTJ element of claim 17, wherein the non-magnetic sub-layer comprises Ta.

48. The MTJ element of claim 47, wherein the second ferromagnetic sub-layer further comprises another layer, wherein said another layer comprises CoFeB.

49. The MTJ element of claim 48, wherein said another layer of the second ferromagnetic sub-layer is arranged between the non-magnetic sub-layer and the layer of the second ferromagnetic sub-layer comprising NiFe.

50. The MTJ element of claim 47, wherein the second ferromagnetic sub-layer further comprises another layer, wherein said another layer comprises CoFe.

51. The MTJ element of claim 50, wherein said another layer of the second ferromagnetic sub-layer is arranged between the non-magnetic sub-layer and the layer of the second ferromagnetic sub-layer comprising NiFe.

52. The MTJ element of claim 17, wherein at least one of the first ferromagnetic sub-layer and the second ferromagnetic sub-layer has a thickness on the order of approximately 5Å to 5Å.

53. The MTJ element of claim 52, wherein said non-magnetic sub-layer has a thickness of approximately 2Å to 5Å.

54. The MTJ element of claim 52, wherein said non-magnetic sub-layer has a thickness of approximately 10Å to 15Å.

55. The MTJ element of claim 52, wherein said non-magnetic sub-layer has a thickness of approximately 15Å to 20Å.

56. The MTJ element of claim 17, wherein said non-magnetic sub-layer has a thickness of approximately 2Å to 5Å.

57. The MTJ element of claim 17, wherein said non-magnetic sub-layer has a thickness of approximately 10Å to 15Å.

58. The MTJ element of claim 17, wherein said non-magnetic sub-layer has a thickness of approximately 15Å to 20Å.

59. The MTJ element of claim 17, wherein said non-magnetic sub-layer has a thickness, and wherein said non-magnetic sub-layer having said thickness provides a ferromagnetic coupling between the first ferromagnetic sub-layer and the second ferromagnetic sub-layer.

60. The MTJ element of claim 17, wherein said non-magnetic sub-layer has a thickness, and wherein said non-magnetic sub-layer having said thickness provides a synthetic anti-ferromagnetic coupling between the first ferromagnetic sub-layer and the second ferromagnetic sub-layer.

61. The MTJ element of claim 17, wherein said non-magnetic sub-layer is configured to provide a ferromagnetic coupling between the first ferromagnetic sub-layer and the second ferromagnetic sub-layer.

62. The MTJ element of claim 61, wherein said non-magnetic sub-layer has a thickness of approximately 2Å to 5Å.

63. The MTJ element of claim 61, wherein said non-magnetic sub-layer has a thickness of approximately 15Å to 20Å.

64. The MTJ element of claim 17, wherein said non-magnetic sub-layer is configured to provide a synthetic anti-ferromagnetic coupling between the first ferromagnetic sub-layer and the second ferromagnetic sub-layer.

65. The MTJ element of claim 64, wherein said non-magnetic sub-layer has a thickness of approximately 10Å to 15Å.

* * * * *